（12) United States Patent
Voll et al.

(10) Patent No.: US 8,898,117 B2
(45) Date of Patent: Nov. 25, 2014

(54) SYSTEM AND METHOD FOR FILE SYSTEM LEVEL COMPRESSION USING COMPRESSION GROUP DESCRIPTORS

(75) Inventors: Jim Voll, Sunnyvale, CA (US); Sandeep Yadav, Sunnyvale, CA (US)

(73) Assignee: NetApp, Inc., Sunnyvale, CA (US)

( * ) Notice: Subject to any disclaimer, the term of this patent is extended or adjusted under 35 U.S.C. 154(b) by 1 day.

(21) Appl. No.: 13/589,763

(22) Filed: Aug. 20, 2012

(65) Prior Publication Data

US 2013/0018857 A1    Jan. 17, 2013

Related U.S. Application Data

(63) Continuation of application No. 12/198,952, filed on Aug. 27, 2008, now Pat. No. 8,285,687.

(51) Int. Cl.
*G06F 17/30* (2006.01)
*H03M 7/30* (2006.01)
*G06F 3/06* (2006.01)

(52) U.S. Cl.
CPC ........... *H03M 7/30* (2013.01); *G06F 3/0643* (2013.01); *G06F 3/0689* (2013.01); *G06F 3/0641* (2013.01); *G06F 3/0608* (2013.01)
USPC .......................................... 707/687; 707/693

(58) Field of Classification Search
CPC ................... G06F 17/30153; G06F 17/30194; G06F 17/30174; G06F 17/30575; G06F 17/00; G06F 17/30091; G06F 17/30129; G06F 17/30244; G06F 17/3025; G06F 17/30371; G06F 17/30501; G06F 17/30; G06F 17/30955; G06F 17/30905
USPC ................................................. 707/687, 693
See application file for complete search history.

(56) References Cited

U.S. PATENT DOCUMENTS

| | | | |
|---|---|---|---|
| 5,155,484 A | 10/1992 | Chambers, IV | |
| 5,237,675 A | 8/1993 | Hannon, Jr. | |
| 5,258,932 A * | 11/1993 | Matsuzaki | ...................... 703/15 |
| 5,481,701 A | 1/1996 | Chambers, IV | |
| 5,551,020 A | 8/1996 | Flax et al. | |

(Continued)

OTHER PUBLICATIONS

Bilenko, M., et al., "Adaptive Duplicate Detection Using Learnable String Similarity Measures". Published in Proceedings of the Ninth ACM SIGKDD International Conference on Knowledge, Aug. 23, 2003, pp. 1-10.

(Continued)

*Primary Examiner* — Apu Mofiz
*Assistant Examiner* — Fariborz Khoshnoodi
(74) *Attorney, Agent, or Firm* — Cesari and McKenna, LLP

(57) ABSTRACT

A system and method for transparently compressing file system data using compression group descriptors is provided. When data contained within a compression group be compressed beyond a predefined threshold value, a compression group descriptor is included in the compression group that signifies that the data for the group of level 0 blocks is compressed into a lesser number of physical data blocks. When performing a read operation, the file system first determines the appropriate compression group that contains the desired data and determines whether the compression group has been compressed. If so, the file system decompresses the data in the compression group before returning the decompressed data. If the magic value is not the first pointer position, then the data within the compression group was previously stored in an uncompressed format, and the data may be returned without performing a decompression operation.

15 Claims, 6 Drawing Sheets

(56) References Cited

U.S. PATENT DOCUMENTS

| | | | |
|---|---|---|---|
| 5,652,857 A | | 7/1997 | Shimoi et al. |
| 5,802,599 A | | 9/1998 | Cabrera |
| 5,990,810 A | | 11/1999 | Williams |
| 6,452,602 B1 | * | 9/2002 | Morein .................. 345/555 |
| 6,779,088 B1 | * | 8/2004 | Benveniste et al. ........... 711/145 |
| 7,200,603 B1 | * | 4/2007 | Hitz et al. ............................. 1/1 |
| 7,289,643 B2 | | 10/2007 | Brunk et al. |
| 7,409,494 B2 | | 8/2008 | Edwards et al. |
| 2004/0030668 A1 | | 2/2004 | Pawlowski et al. |
| 2004/0107395 A1 | * | 6/2004 | Volkerink et al. ............. 714/732 |
| 2004/0148306 A1 | | 7/2004 | Moulton et al. |
| 2005/0071436 A1 | | 3/2005 | Hsu et al. |
| 2005/0071579 A1 | * | 3/2005 | Luick .......................... 711/154 |
| 2007/0097230 A1 | | 5/2007 | Parulski et al. |
| 2007/0255758 A1 | | 11/2007 | Zheng et al. |
| 2008/0294696 A1 | | 11/2008 | Frandzel et al. |

OTHER PUBLICATIONS

Burrows, M., et al., "On-Line Data Compression in a Log-Structured File System", Fifth International Conference on Architectural Support for Programming Languages and Operating Systems (ASPLOS-V), Oct. 1992, published by ACM Press, 25 pages.

Crochemore, M. et al., "Pattern Matching and Text Compression Algorithms", dated Jan. 8, 2003, retrieved from http://citeseer.comp.nus.edu.sg/595025.html, 50 pages.

Hernandez, M. A., et al., "Real-world Data is Dirty: Data Cleansing and the Merge/Purge Problem". Published in Data Mining and Knowledge Discovery, vol. 2, pp. 1-31 (48 pages).

Kulkarni, P., et al., "Redundancy Elimination Within Large Collections of Files", Proceedings of the 2004 USENIX Annual Technical Conference, Boston, MA, Jun. 2004, 15 pages.

Lee, et al. "IntelliClean: a Knowledge-based Intelligent Data Cleaner", published by ACM International Conference on Knowledge Discovery and Data Mining, pp. 290-294.

Network Appliance, Inc., PCT Notification of Transmittal of the International Search Report and the Written Opinion of the International Searching Authority, or the Declaration, International Application No. PCT/US2007/010222, International Filing Date: Apr. 26, 2007; Date of Document Mailing: Apr. 15, 2008, 15 pages.

Network Appliance, Inc., PCT Notification of Transmittal of the International Search Report and the Written Opinion of the International Searching Authority, or the Declaration, International Application No. PCT/US2008/006536, International Filing Date: May 22, 2008; Date of Document Mailing: Sep. 29, 2008, 13 pages.

Quinlan, S., et al., "Venti: A New Approach to Archival Storage", Proceedings of the Conference on File and Storage Technologies, USENIX Association, Berkeley, CA, Jan. 28, 2002, 14 pages.

Reichenberger, C., "Delta Storage for Arbitrary Non-Text Files", Software Configuration Management Workshop, Proceedings of the 3$^{rd}$ International Workshop on Software Configuration Management, Trondheim, Norway, Jun. 12-14, 1991, ACM Press, pp. 144-152.

Zheng, et al., U.S. Appl. No. 11/105,895, filed Apr. 13, 2005, entitled Method and Apparatus for Identifying and Eliminating Duplicate Data Blocks and Sharing Data Blocks in a Storage System, 46 pages.

Patterson, D.A., et al., "A Case for Redundant Arrays of Inexpensive Disks (RAID)," Proceedings of the International Conference on Management of Data (SIGMOD), Jun. 1988, 8 pages.

* cited by examiner

SYSTEM AND METHOD FOR FILE SYSTEM LEVEL COMPRESSION USING COMPRESSION GROUP DESCRIPTORS

CROSS-REFERENCE TO RELATED APPLICATION

The present application is a continuation of U.S. patent application Ser. No. 12/198,952 which was filed on Aug. 27, 2008 now U.S. Pat. No. 8,285,687 by Jim Voll et al. for a SYSTEM AND METHOD FOR FILE SYSTEM LEVEL COMPRESSION USING COMPRESSION GROUP DESCRIPTORS.

FIELD OF THE INVENTION

The present invention relates to storage systems and, more specifically, to compressing data in a storage system.

BACKGROUND OF THE INVENTION

A storage system typically comprises one or more storage devices into which information may be entered, and from which information may be obtained, as desired. The storage system includes a storage operating system that functionally organizes the system by, inter alia, invoking storage operations in support of a storage service implemented by the system. The storage system may be implemented in accordance with a variety of storage architectures including, but not limited to, a network-attached storage environment, a storage area network and a disk assembly directly attached to a client or host computer. The storage devices are typically disk drives organized as a disk array, managed according to a storage protocol, wherein the term "disk" commonly describes a self-contained rotating magnetic media storage device. The term disk in this context is synonymous with persistent storage, such as a hard disk drive (HDD) or direct access storage device (DASD).

Storage of information on the disk array is preferably implemented as one or more storage "volumes" of physical disks, defining an overall logical arrangement of disk space. The disks within a volume are typically organized as one or more groups, wherein each group may be operated as a Redundant Array of Independent (or Inexpensive) Disks (RAID). Most RAID implementations enhance the reliability/integrity of data storage through the redundant writing of data "stripes" across a given number of physical disks in the RAID group, and the appropriate storing of redundant information (parity) with respect to the striped data. The physical disks of each RAID group may include disks configured to store striped data (i.e., data disks) and disks configured to store parity for the data (i.e., parity disks). The parity may thereafter be retrieved to enable recovery of data lost when a disk fails. The term "RAID" and its various implementations are well-known and disclosed in *A Case for Redundant Arrays of Inexpensive Disks (RAID)*, by D. A. Patterson, G. A. Gibson and R. H. Katz, Proceedings of the International Conference on Management of Data (SIGMOD), June 1988.

The storage operating system of the storage system may implement a high-level module, such as a file system, to logically organize data containers for the information. For example, the information may be stored on the disks as a hierarchical structure of data containers, such as directories, files, and blocks. Each "on-disk" file may be implemented as set of data structures, i.e., disk blocks, configured to store information, such as the actual data for the file. These data blocks are organized within a volume block number (vbn) space that is maintained by the file system. The file system may also assign each data block in the file a corresponding "file offset" or file block number (fbn). The file system typically assigns sequences of fbns on a per-file basis, whereas vbns are assigned over a larger volume address space. The file system organizes the data blocks within the vbn space as a "logical volume"; each logical volume may be, although is not necessarily, associated with its own file system. The file system typically consists of a contiguous range of vbns from zero to n, for a file system of size n+1 blocks.

When accessing a block of a file in response to servicing a client request, the file system specifies a vbn that is translated at the file system/RAID system boundary into a disk block number (dbn) location on a particular disk (disk, dbn) within a RAID group of the physical volume. Each block in the vbn space and in the dbn space is typically fixed, e.g., 4 k bytes (kB), in size; accordingly, there is typically a one-to-one mapping between the information stored on the disks in the dbn space and the information organized by the file system in the vbn space. The (disk, dbn) location specified by the RAID system is further translated by a disk driver system of the storage operating system into a plurality of sectors (e.g., a 4 kB block with a RAID header translates to 8 or 9 disk sectors of 512 or 520 bytes) on the specified disk.

The requested block is then retrieved from disk and stored in a buffer cache of the memory as part of a buffer tree of the file. The buffer tree is an internal representation of blocks for a file stored in the buffer cache and maintained by the file system. Broadly stated, the buffer tree has an inode at the root (top-level) of the file. An inode is a data structure used to store information, such as metadata, about a file, whereas the data blocks are structures used to store the actual data for the file. The information contained in an inode may include, e.g., ownership of the file, access permission for the file, size of the file, file type and references to locations on disk of the data blocks for the file. The references to the locations of the file data are provided by pointers, which may further reference indirect blocks that, in turn, reference the data blocks, depending upon the quantity of data in the file. Each pointer may be embodied as a vbn to facilitate efficiency among the file system and the RAID system when accessing the data on disks.

Storage systems may be utilized as secondary storage systems, such as the Near-Store line of products available from NetApp, Inc. of Sunnyvale, Calif. Such secondary storage systems typically utilize magnetic disk drives in place of magnetic tape and/or optical media. A noted disadvantage of such secondary systems is that the cost of magnetic disk drives is higher than that of tape and/or optical media. One technique to reduce the cost is to compress data (e.g., file system data) using a compression system prior to storing the data on disk, thereby reducing the total disk space required. Such a technique typically requires one or more special application program interfaces (APIs) to access the compression system. However, this technique typically requires client side modifications that bind (tie) a client to a single vendor for compression. Furthermore, certain client applications may be incapable of modification to support alternative data access techniques required by the compression system.

SUMMARY OF THE INVENTION

The present invention overcomes the disadvantages of the prior art by providing a system and method for transparently compressing file system data using compression groups. As used herein, a compression group refers to a number of adjacent level 0 data block pointers contained within an indirect block or an inode. Illustratively, a compression group comprises eight adjacent level 0 data blocks. In operation, should the data contained within a compression group be compressed beyond a predefined threshold value, a compression group descriptor is included in the compression group that signifies that the data for the adjacent level 0 blocks is compressed into a lesser number of physical data blocks.

When data is to be written to persistent storage of the storage system, a file system passes the write data to a compression module of a storage operating system that compresses the data using one of a plurality of compression techniques. The compression module then examines the compressed data to determine whether the compressed data has reached a predefined threshold, i.e., a determination is made whether a sufficient number of data blocks are no longer needed to store the compressed data. Illustratively, the compressed data frees at least two of the eight blocks of the compression group. However, in alternative embodiments, other thresholds may be utilized. If the compressed data has not reached the predefined threshold, the uncompressed data is written as the level 0 data for the compression group. However, if the compressed data reaches the predefined threshold, the system generates a compression group descriptor for the block pointers. Specifically, a magic value, which is a physical block location identifying a predefined and reserved physical block is inserted as the first pointer (a header) of the compression group. Similarly, one or more footers, i.e., magic values stored at the end of the compression group, are also generated. The system then writes the compression group and its associated compressed data to one or more storage devices.

When performing a read operation, the file system first determines the appropriate compression group that contains the desired data. The file system then examines the pointers within the compression group and determines if a magic value is in the first pointer position of the compression group. If a magic value is in the first pointer position, then the file system decompresses the data in the compression group before returning the decompressed data. If a magic value is not the first pointer position, then the data within the compression group was previously stored in an uncompressed format, and the data may be returned, e.g., to a client, without performing a decompression operation.

BRIEF DESCRIPTION OF THE DRAWINGS

The above and further advantages of the invention may be better understood by referring to the following description in conjunction with the accompanying drawings in which like reference numerals indicate identical or functionally similar elements.

DETAILED DESCRIPTION OF AN ILLUSTRATIVE EMBODIMENT

A. Storage System Environment

Figure 1:
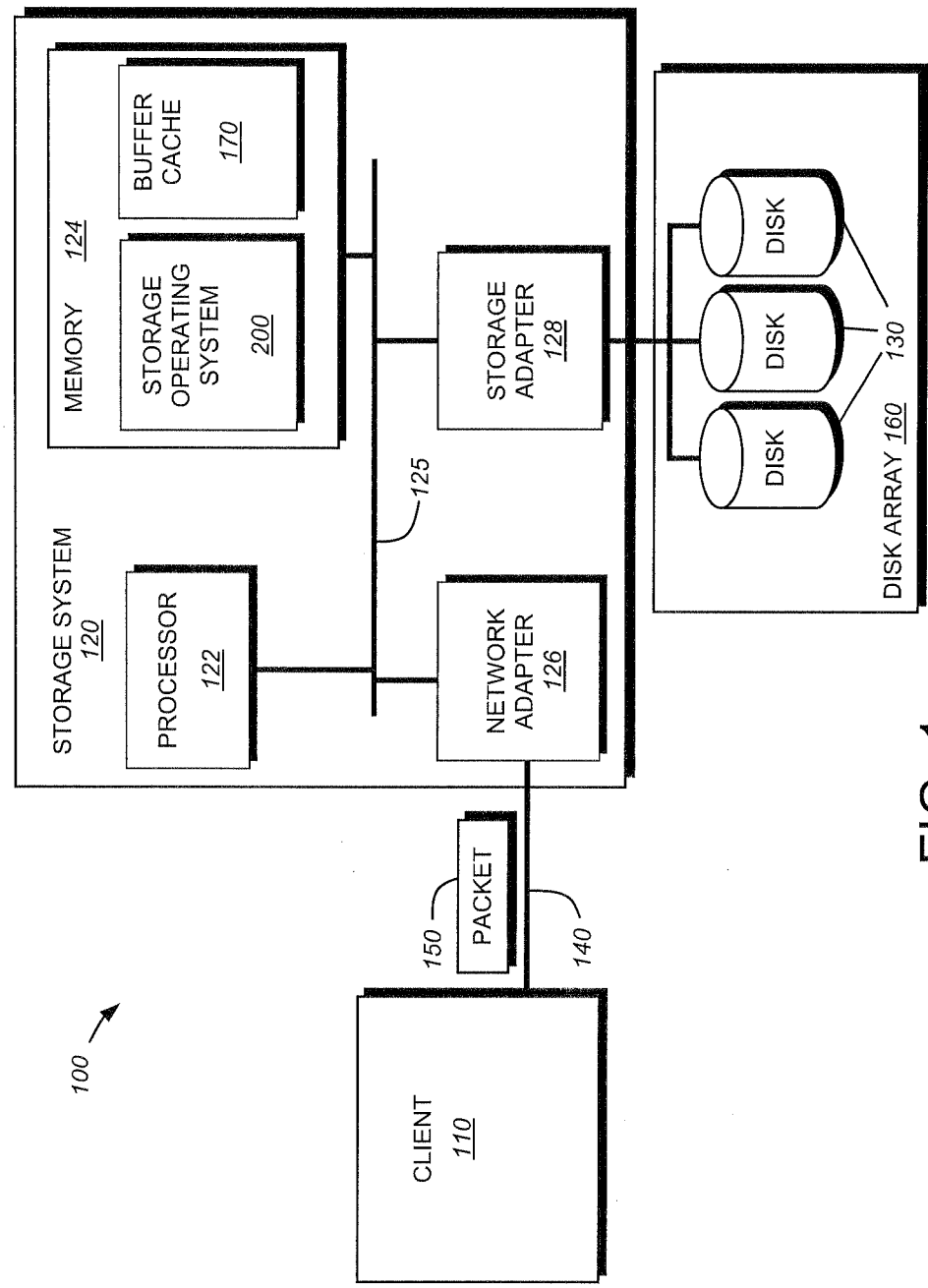
FIG. 1 is a schematic block diagram of a storage system environment in accordance with an illustrative embodiment of the present invention.

FIG. 1 is a schematic block diagram of a storage system environment 100 including a storage system 120 that may be advantageously used in accordance with an illustrative embodiment of the present invention. The storage system is a computer that provides storage service relating to the organization of information on storage devices, such as disks 130 of a disk array 160. The storage system 120 comprises a processor 122, a memory 124, a network adapter 126 and a storage adapter 128 interconnected by a system bus 125. The storage system 120 also includes a storage operating system 200 that illustratively implements a high-level module, such as a file system, to logically organize the information as a hierarchical structure of data containers, such as directories, files, and special types of files called virtual disks (hereinafter "blocks") on the disks.

In the illustrative embodiment, the memory 124 comprises storage locations that are addressable by the processor 122 and adapters for storing software program code. A portion of the memory may be further organized as a "buffer cache" 170 for storing data structures, such as (de-)compression buffers (not shown)) associated with the present invention. The processor 122 and adapters may, in turn, comprise processing elements and/or logic circuitry configured to execute the software program code and to manipulate the data structures. Storage operating system 200, portions of which are typically resident in memory and executed by the processing elements, functionally organizes the system 120 by, inter alia, invoking storage operations executed by the storage system. It will be apparent to those skilled in the art that other processing and memory means, including various computer readable media, may be used for storing and executing program instructions pertaining to the inventive technique described herein.

The network adapter 126 comprises the mechanical, electrical and signaling circuitry needed to connect the storage system 120 to a client 110 over a computer network 140, which may comprise a point-to-point connection or a shared medium, such as a local area network. Illustratively, the computer network 140 may be embodied as an Ethernet network or a Fibre Channel (FC) network. The client 110 may communicate with the storage system over network 140 by exchanging discrete frames or packets 150 of data according to pre-defined protocols, such as the Transmission Control Protocol/Internet Protocol (TCP/IP).

The client 110 may be a general-purpose computer configured to execute applications. Moreover, the client 110 may interact with the storage system 120 in accordance with a client/server model of information delivery. That is, the client 110 may request the services of the storage system 120, and the system may return the results of the services requested by the client 110, by exchanging packets 150 over the network 140. The client 110 may issue packets including file-based access protocols, such as the Common Internet File System (CIFS) protocol or Network File System (NFS) protocol, over TCP/IP when accessing information in the form of files and directories. Alternatively, the client may issue packets including block-based access protocols, such as the Small Computer Systems Interface (SCSI) protocol encapsulated over TCP (iSCSI) and SCSI encapsulated over Fibre Channel (FCP), when accessing information in the form of blocks. In accordance with an illustrative embodiment of the present invention, the client 110 does not need to be modified to utilize the compression provided by the present invention. Illustratively, unmodified clients 110 may be utilized while transparent compression occurs at the file system level of the storage operating system 200.

The storage adapter 128 cooperates with the storage operating system 200 executing on the system 120 to access information requested by a user (or client). The information may be stored on any type of attached array of writable storage device media such as video tape, optical, DVD, magnetic tape, bubble memory, electronic random access memory, micro-electro mechanical and any other similar media adapted to store information, including data and parity information. However, as illustratively described herein, the information is preferably stored on disks 130, such as hard disk drives (HDDs) and/or direct access storage devices (DASDs), of array 160. The storage adapter 128 includes input/output (I/O) interface circuitry that couples to the disks 130 over an I/O interconnect arrangement, such as a conventional high-performance, FC serial link topology.

Storage of information on array 160 is preferably implemented as one or more storage "volumes" that comprise a collection of physical storage disks 130 cooperating to define an overall logical arrangement of volume block number (vbn) space on the volume(s). Each logical volume is generally, although not necessarily, associated with its own file system. The disks within a logical volume/file system are typically organized as one or more groups, wherein each group may be operated as a Redundant Array of Independent (or Inexpensive) Disks (RAID), managed according to a RAID protocol. Most RAID implementations, such as a RAID-4 level implementation, enhance the reliability/integrity of data storage through the redundant writing of data "stripes" across a given number of physical disks in the RAID group, and the appropriate storing of parity information with respect to the striped data. The illustrative RAID protocol also implements a 32-bit checksum value for each block of data written to disk, to verify data integrity. The illustrative example of a RAID implementation is a RAID-4 level implementation, although it should be understood that other types and levels of RAID implementations may be used in accordance with the inventive principles described herein. Likewise, other implementations and/or protocols may be used to organize the disks of the logical volume/file system.

In an illustrative embodiment, the storage system 120 comprises a nearline storage system that is configured for archival backup operations. Use of the teachings of the present invention enables transparent compression of data stored to storage devices, such as disks, thereby reducing the total cost of ownership of disk based nearline storage systems. In such an embodiment, the client 110 may comprise a conventional storage system that utilizes the storage system 120 as a backup location. However, it should be noted that the teachings of the present invention may be utilized with any suitable storage system. As such, the description of storage systems 120 comprising a nearline storage system should be taken as exemplary only.

B. Storage Operating System

To facilitate access to the disks 130, the storage operating system 200 implements a write-anywhere file system that cooperates with virtualization modules to "virtualize" the storage space provided by disks 130. Illustratively, the file system logically organizes the information as a hierarchical structure of named data containers, such as directories and files on the disks. Each "on-disk" file may be implemented as set of disk blocks configured to store information, such as data, whereas the directory may be implemented as a specially formatted file in which names and links to other files and directories are stored. The virtualization modules allow the file system to further logically organize information as a hierarchical structure of data containers, such as blocks on the disks that are exported as named logical unit numbers (luns).

In the illustrative embodiment, the storage operating system is preferably the NetApp® Data ONTAP® operating system available from NetApp, Inc., Sunnyvale, Calif., that implements a Write Anywhere File Layout (WAFL®) file system. However, it is expressly contemplated that any appropriate storage operating system may be enhanced for use in accordance with the inventive principles described herein. As such, where the term "Data ONTAP" is employed, it should be taken broadly to refer to any storage operating system that is otherwise adaptable to the teachings of this invention.

Figure 2:
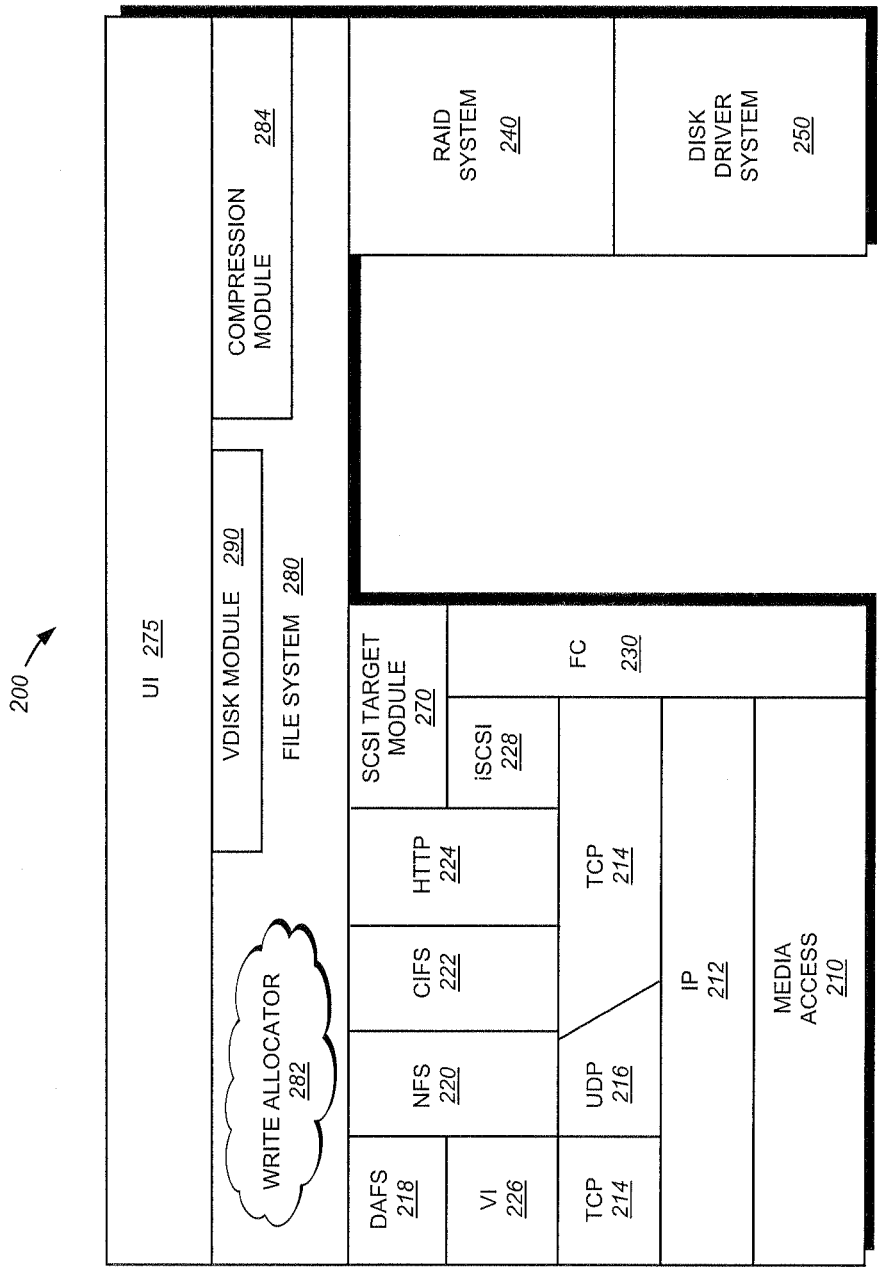
FIG. 2 is a schematic block diagram of a storage operating system in accordance with an illustrative embodiment of the present invention.

FIG. 2 is a schematic block diagram of a storage operating system 200 that may be advantageously used with the present invention. The storage operating system comprises a series of software layers organized to form an integrated network protocol stack or, more generally, a multi-protocol engine that provides data paths for clients to access information stored on the storage system using block and file access protocols. The protocol stack includes a media access layer 210 of network drivers (e.g., gigabit Ethernet drivers) that interfaces to network protocol layers, such as the IP layer 212 and its supporting transport mechanisms, the TCP layer 214 and the User Datagram Protocol (UDP) layer 216. A file system protocol layer provides multi-protocol file access and, to that end, includes support for the Direct Access File System (DAFS) protocol 218, the NFS protocol 220, the CIFS protocol 222, and the Hypertext Transfer Protocol (HTTP) protocol 224. A Virtual Interface (VI) layer 226 implements the VI architecture to provide direct access transport (DAT) capabilities, such as RDMA, as required by the DAFS protocol 218.

An iSCSI driver layer 228 provides block protocol access over the TCP/IP network protocol layers, while a FC driver layer 230 receives and transmits block access requests and responses to and from the storage system. The FC and iSCSI drivers provide FC-specific and iSCSI-specific access control to the blocks and, thus, manage exports of luns to either iSCSI or FCP or, alternatively, to both iSCSI and FCP when accessing the blocks on the storage system. In addition, the storage operating system includes a storage module embodied as a RAID system 240 that implements a storage (e.g., RAID) protocol manage the storage and retrieval of information to and from the volumes/disks in accordance with I/O operations, and a disk driver system 250 that implements a disk access protocol such as, e.g., the SCSI protocol.

Bridging the disk software layers with the integrated network protocol stack layers is a virtualization system that is implemented by a file system 280 interacting with virtualization modules illustratively embodied as, e.g., vdisk module 290 and SCSI target module 270. The vdisk module 290 is layered on the file system 280 to enable access by administrative interfaces, such as a user interface (UI) 275, in response to a user (system administrator) issuing commands to the storage system. The SCSI target module 270 is disposed between the FC and iSCSI drivers 228, 230 and the file system 280 to provide a translation layer of the virtualization system between the block (lun) space and the file system space, where luns are represented as blocks. The UI 275 is disposed over the storage operating system in a manner that enables administrative or user access to the various layers and systems.

According to an illustrative embodiment of the present invention, the storage operating system 200 also includes a compression module 284. The compression module 284 implements the novel transparent compression group compression in accordance with an illustrative embodiment of the present invention. The compression module 284 may illustratively implement one or more compression techniques, e.g., LZ77, etc., that may be utilized in accordance with alternative embodiments of the present invention However, in alternative embodiments, the compression techniques may be implemented by one or more separate modules (not shown). As such, the description of the compression module 284 implementing one or more compression techniques should be taken as exemplary only.

Illustratively, a plurality of compression techniques may be utilized on differing volumes being served by the storage system 120. Thus, for example, if a volume is storing a particular type of data that is compressed especially well by a specific compression technique, the compression module 284 may be configured to utilize that particular compression technique on that volume. In an illustrative embodiment, compression types may be configured on a per volume basis; however, in alternative embodiments, compression types may vary based on differing levels of granularity, e.g., qtrees, flexible volumes, directories, etc. Thus, for example, a particular flexible volume may be compressed using a first compression technique that works well with the type of data contained within the flexible volume. In such a flexible volume, the compression group descriptor, specifically the magic value (described further below) contained within the first pointer location of the compression group, may reference a specific predetermined physical block location. Within a same data container other files and/or containers may be compressed using alternative compression techniques. These may be identified by alternative magic values stored within the first pointer position of a compression group.

Thus, in an illustrative embodiment, the magic value, described further below, identifies a type of compression utilized for a particular compression group. By reserving a plurality of physical blocks for use as magic values, the present invention may be utilized with a plurality of compression techniques. Furthermore, as each magic value may be associated with a particular compression group, compression techniques may be selected on a per compression group basis (or any larger granularity).

The file system is illustratively a message-based system that provides logical volume management capabilities for use in access to the information stored on the storage devices, such as disks. That is, in addition to providing file system semantics, the file system 280 provides functions normally associated with a volume manager. These functions include (i) aggregation of the disks, (ii) aggregation of storage bandwidth of the disks, and (iii) reliability guarantees, such as mirroring and/or parity (RAID). The file system 280 illustratively implements a write-anywhere file system (such as the WAFL® file system available from NetApp, Inc., Sunnyvale, Calif.) having an on-disk format representation that is block-based using, e.g., 4 kilobyte (KB) blocks and using index nodes ("inodes") to identify files and file attributes (such as creation time, access permissions, size, and block location). The file system uses files to store metadata describing the layout of its file system; these metadata files include, among others, an inode file. A file handle, i.e., an identifier that includes an inode number, is used to retrieve an inode from disk.

Broadly stated, all inodes of the write-anywhere file system are organized into the inode file. A file system (FS) info block specifies the layout of information in the file system and includes an inode of a file that includes all other inodes of the file system. Each logical volume (file system) has an FS info block that is preferably stored at a fixed location within, e.g., a RAID group. The inode of the inode file may directly reference (point to) blocks of the inode file or may reference indirect blocks of the inode file that, in turn, reference direct blocks of the inode file. Within each direct block of the inode file are embedded inodes, each of which may reference indirect blocks that, in turn, reference data blocks of a file.

Operationally, a read request from the client 110 is forwarded as a packet 150 over the computer network 140 and onto the storage system 120 where it is received at the network adapter 126. A network driver (of layer 210 or layer 230) processes the packet and, if appropriate, passes it on to a network protocol and file access layer for additional processing prior to forwarding to the write-anywhere file system 280. Here, the file system generates operations to load (retrieve) the requested data from disk 130 if it is not resident "in core", i.e., in the buffer cache 170. If the information is not in the cache, the file system 280 indexes into the inode file using the inode number to access an appropriate entry and retrieve a logical vbn. The file system then passes a message structure including the logical vbn to the RAID system 240; the logical vbn is mapped to a disk identifier and disk block number (disk, dbn) and sent to an appropriate driver (e.g., SCSI) of the disk driver system 250. The disk driver accesses the dbn from the specified disk 130 and loads the requested data block(s) in buffer cache 170 for processing by the storage system. Upon completion of the request, the storage system (and operating system) returns a reply to the client 110 over the network 140. A write operation issued by the client 110 to the storage system 120 follows the same "path" through the storage system 100.

It should be noted that the software "path" through the storage operating system layers described above needed to perform data storage access and write operations for client requests received at the storage system may alternatively be implemented in hardware. That is, in an alternate embodiment of the invention, a storage access request data path may be implemented as logic circuitry embodied within a field programmable gate array (FPGA) or an application specific integrated circuit (ASIC). This type of hardware implementation increases the performance of the storage service provided by storage system 120 in response to a request issued by client 110. Moreover, in another alternate embodiment of the invention, the processing elements of adapters 126, 128 may be configured to offload some or all of the packet processing and storage access operations, respectively, from processor 122, to thereby increase the performance of the storage service provided by the system. It is expressly contemplated that the various processes, architectures and procedures described herein can be implemented in hardware, firmware or software operating as a single or distributed system.

As used herein, the term "storage operating system" generally refers to the computer-executable code operable to perform a storage function in a storage system, e.g., that manages data access and may, in the case of a file server, implement file system semantics. In this sense, the Data ONTAP® software is an example of such a storage operating system implemented as a microkernel and including the file system 280 to implement the WAFL® file system semantics and manage data access. Illustratively, the storage operating system 200 includes a compression module 284 for providing compression group compression of the file system; however, in alternate embodiments, the compression functionality may be implemented in other modules of the storage operating system 200. The storage operating system can also be implemented as an application program operating over a general-purpose operating system, such as UNIX® or Windows XP®, or as a general-purpose operating system with configurable functionality, which is configured for storage applications as described herein.

In addition, it will be understood to those skilled in the art that the inventive technique described herein may apply to any type of special-purpose (e.g., file server, filer, or storage appliance) or general-purpose computer, including a standalone computer or portion thereof, embodied as or including a storage system 120. An example of a storage appliance that may be advantageously used with the present invention is described in commonly owned U.S. Patent Application Publication No. 2004/0030668 A1, filed on Aug. 8, 2002, titled MULTI-PROTOCOL STORAGE APPLIANCE THAT PROVIDES INTEGRATED SUPPORT FOR FILE AND BLOCK ACCESS PROTOCOLS, by Brian Pawlowski, et al. Moreover, the teachings of this invention can be adapted to a variety of storage system architectures including, but not limited to, a network-attached storage environment, a storage area network, and a disk assembly directly-attached to a client or host computer. The term "storage system" should therefore be taken broadly to include such arrangements in addition to any subsystems configured to perform a storage function and associated with other equipment or systems.

C. On-Disk File System Structures

The present invention provides a system and method for transparently compressing file system data using compression groups. As used herein, a compression group refers to a number of adjacent level 0 data block pointers contained within an indirect block or an inode. Illustratively, a compression group comprises eight adjacent level 0 data blocks. In operation, should the data contained within a compression group be compressed beyond a predefined threshold value, a compression group descriptor is included in the compression group that signifies that the data for the adjacent level 0 blocks is compressed into a lesser number of physical data blocks.

When data is to be written to persistent storage of the storage system, a file system passes the write data to a compression module of a storage operating system that compresses the data using one of a plurality of compression techniques. The compression module then examines the compressed data to determine whether the compressed data has reached a predefined threshold, i.e., a determination is made whether a sufficient number of data blocks are no longer needed to store the compressed data. Illustratively, the compressed data frees at least two of the eight blocks of the compression group. However, in alternative embodiments, other thresholds may be utilized. If the compressed data has not reached the predefined threshold, the uncompressed data is written as the level 0 data for the compression group. However, if the compressed data reaches the predefined threshold, the system generates a compression group descriptor for the block pointers. Specifically, a magic value, which is a physical block location identifying a predefined and reserved physical block is inserted as the first pointer (a header) of the compression group. Thus, in an alternative embodiment, the magic value may be any predefined bit pattern that identifies a valid physical block. Similarly, one or more footers, i.e., magic values stored at the end of the compression group, are also generated. The system then writes the compression group and its associated compressed data to one or more storage devices.

When performing a read operation, the file system first determines the appropriate compression group that contains the desired data. The file system then examines the pointers within the compression group and determines if a magic value is in the first pointer position of the compression group. If a magic value is in the first pointer position, then the file system decompresses the data in the compression group before returning the decompressed data. If a magic value is not the first pointer position, then the data within the compression group was previously stored in an uncompressed format, and the data may be returned, e.g., to a client, without performing a decompression operation.

Figure 3:
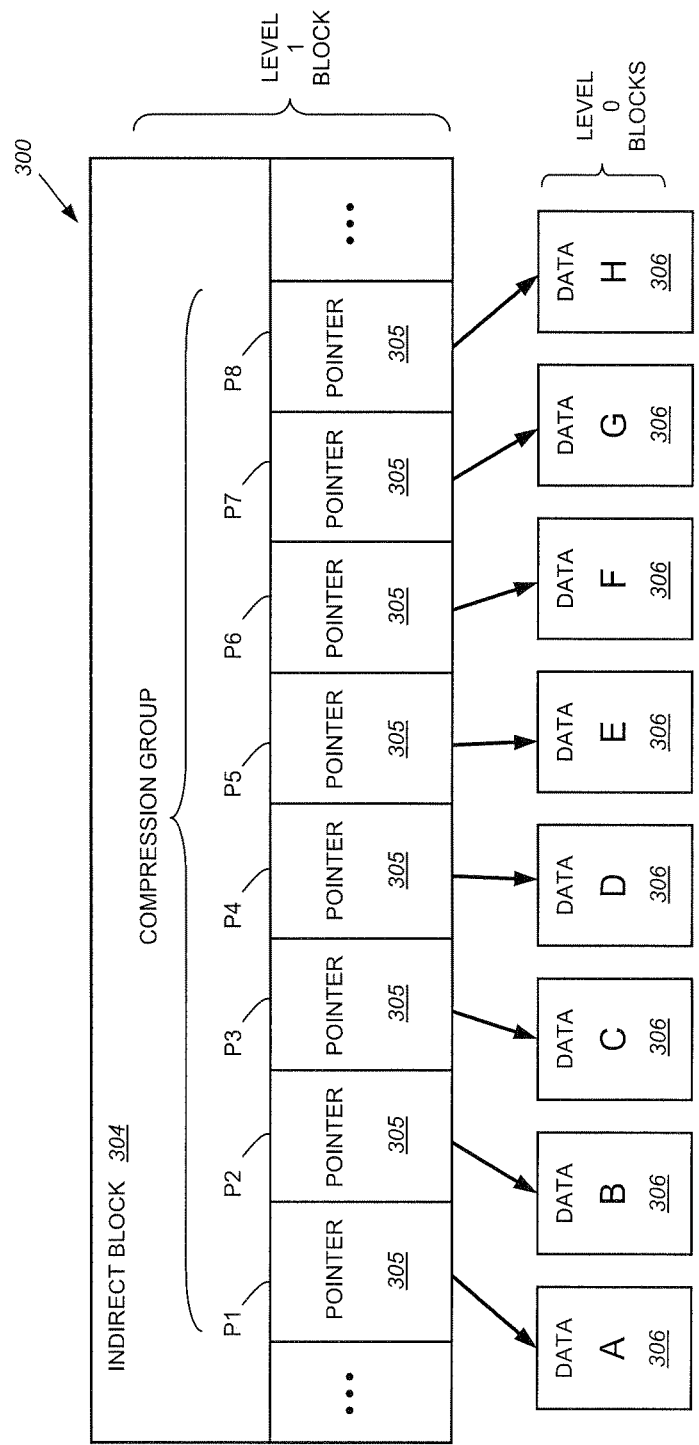
FIG. 3 is a schematic block diagram of an indirect block with pointers directed to a plurality of data blocks in accordance with an illustrative embodiment of the present invention.

FIG. 3 is a schematic block diagram of an exemplary level 1 indirect block 304 in accordance with an illustrative embodiment of the present invention. Illustratively, the indirect block 304 includes a plurality of pointers 305, e.g., P1-P8. Each pointer 305 points to (references) a level 0 data block 306 that is stored at a particular volume block number (vbn). It should be noted that the vbn may comprise a virtual volume block number (vvbn) in storage systems implementing flexible (or virtual) volumes. Flexible volumes are further described in U.S. patent application Ser. No. 10/836,817, now issued as U.S. Pat. No. 7,409,494, entitled EXTENSION OF WRITE ANYWHERE FILE SYSTEM LAYOUT, by John Edwards, et al., the contents of which are hereby incorporated by reference.

Illustratively, the eight pointers 305 (P1-P8) are arranged into a compression group representing eight level 0 data blocks 306 (data A-H). In accordance with an illustrative embodiment of the present invention, compression groups comprise eight adjacent 4 KB level 0 data blocks. However, it should be noted that in accordance with alternative embodiments, the size of compression groups may vary. As such, the description of an eight block compression group should be taken as exemplary only.

Illustratively, each level 1 indirect block may comprise of a number of compression groups. In the example of a 4 KB indirect block, if each pointer is 32 bits wide, then 1024 pointers are stored within the block. In the illustrative embodiment, eight pointers are used per compression group, therefore, 128 compression groups are stored per level 1 indirect block. However, it should be noted that in alternative embodiments, the number of compression groups, pointers per indirect block, size of indirect blocks and/or size of pointers may vary. As such, the description of 128 compression groups per level 1 indirect block should be taken as exemplary only.

It should further be noted that while the present invention is described in terms of compression groups comprising of level 1 indirect block pointers referencing adjacent level 0 data blocks, the principles of the present invention may be utilized in alternative hierarchies. Thus, for example, the principles of the present invention may be utilized with a level 2 indirect block referencing a plurality of level 1 indirect blocks, etc. As such the description of compression groups consisting of level 1 indirect blocks referencing level 0 data blocks should be taken as exemplary only.

Figure 4:
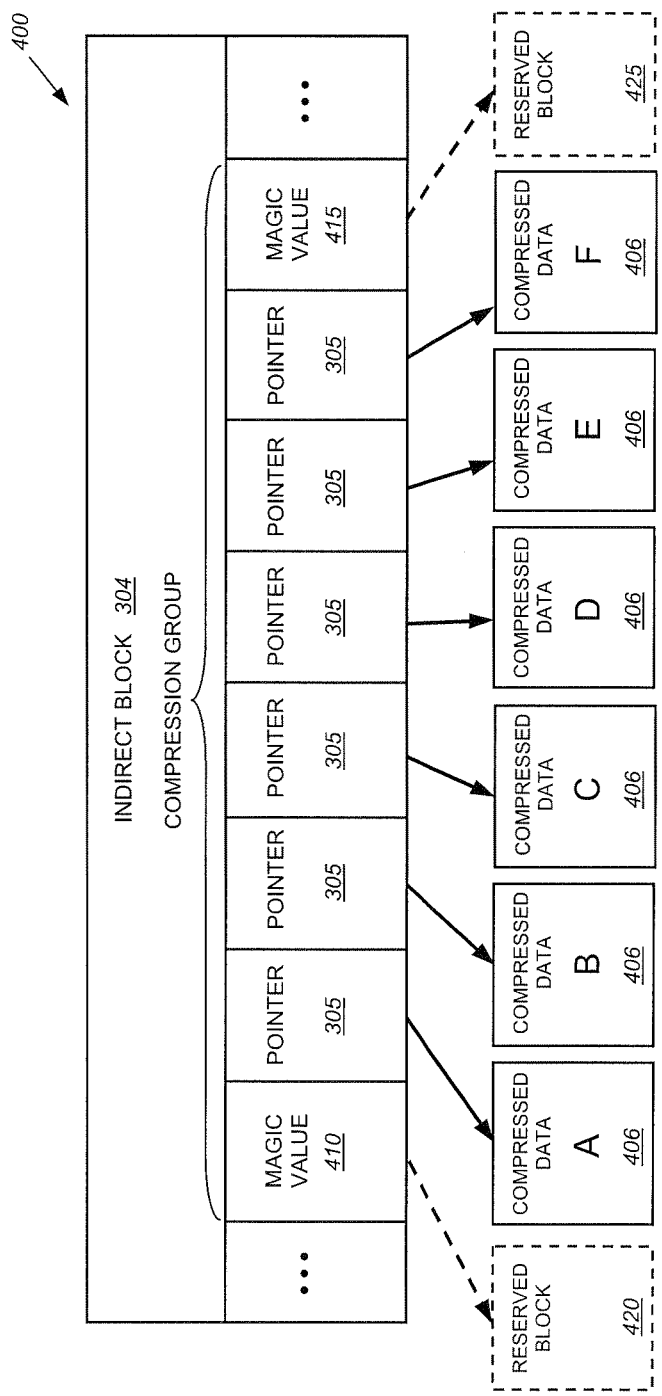
FIG. 4 is a schematic block diagram of an indirect block after compression in accordance with an illustrative embodiment of the present invention.

FIG. 4 is a schematic block diagram illustrating the level 1 indirect block 304 of FIG. 3 after performance of a compression procedure in accordance with an illustrative embodiment of the present invention. Illustratively, the eight level 0 data blocks 305 have been compressed into six level 0 compressed data blocks 406 (compressed data A-F). Furthermore, the first and last pointers of the compression group have been replaced with magic values 410, 415 respectively. Illustratively, the magic values are valid volume block numbers that reference physical reserved blocks 420, 425.

It should be noted that the magic value 410 utilized as a header of a compression group references a predefined reserved physical block 420. Similarly, the magic value 415 utilized as a footer of the compression group references a predefined physical block 425. It should be noted that in an illustrative embodiment of the present invention, the two magic values 410 and 415 are equal, thereby causing both of them to reference the same physical reserved block. However, in alternative embodiments the magic values 410, 415 may differ, i.e., the magic values refer to different reserved physical blocks.

Furthermore, should the data be compressed so that additional physical blocks are not required, additional footer magic value blocks 415 may be utilized. For example, should the eight blocks of a compression group be compressed to a total of four physical blocks, the compression group would then comprise of a magic value 410 representing the header, four pointers 305 that reference the compressed data and three magic values 415 representing the footer. As such, the description shown in reference to FIG. 4 of an eight block compression group being compressed to six physical blocks should be taken as exemplary only. As will be appreciated by one skilled in the art, in alternative embodiments, the header may be increased in size in place of or in addition to the footer. Similarly, magic values may be included within the compression group in locations other than the beginning and the end. As such, the description of a header and/or a footer comprising magic values should be taken as exemplary only.

As noted above, the storage system may reserve a plurality of physical block addresses for use as magic values in accordance with illustrative embodiments of the present invention. According to alternative embodiments of the present invention, each of the magic values (i.e., pointers to specific reserved physical blocks) may be utilized to identify a particular type of compression to be utilized for the compression group. Furthermore, in alternative embodiments, the particular magic value may also be utilized to identify other metadata related to the compression group. For example, a particular magic value 410 may identify a particular reserved physical block. That reserved physical block may be associated with a specific compression function. Thus, for example, a particular reserved block may be referenced by all compression groups utilizing the specified compression technique.

E. File System Compression Using Compression Groups

Figure 5:
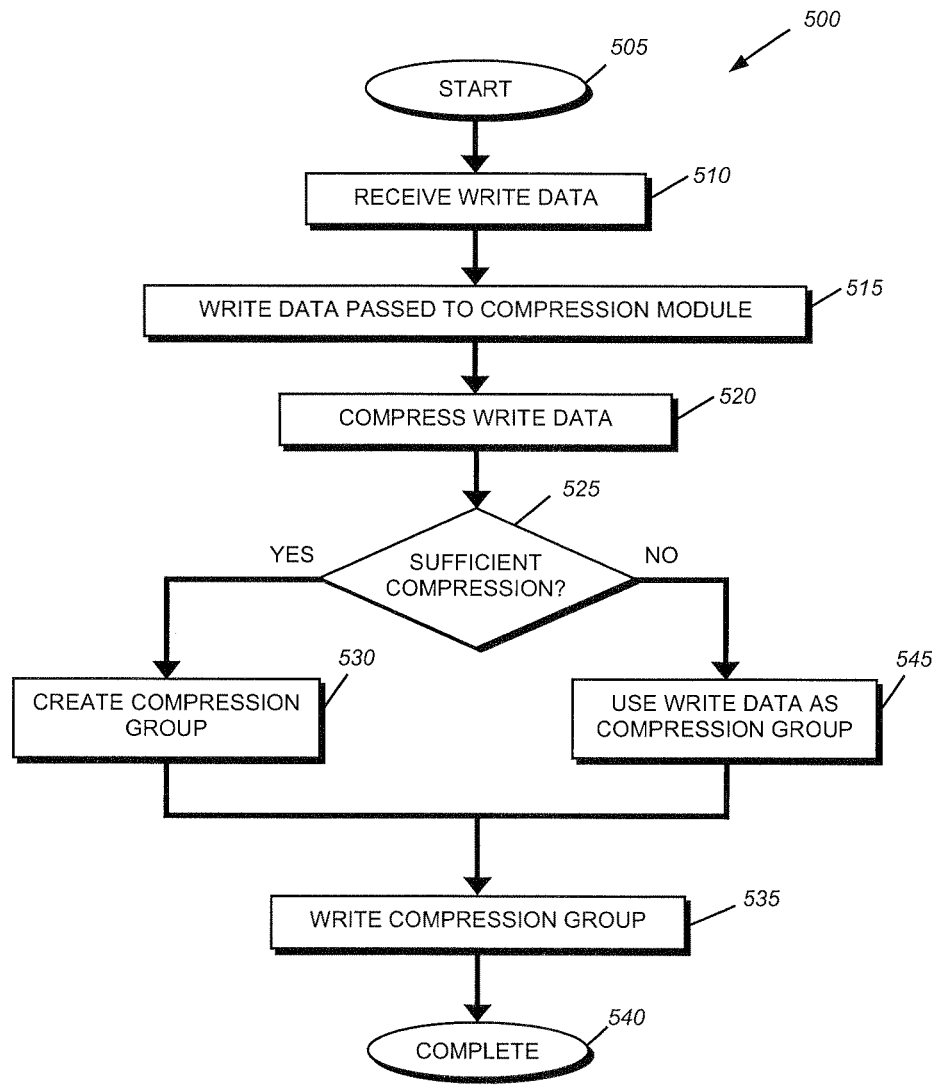
FIG. 5 is a flowchart detailing the steps of a procedure for transparently compressing file system data using compression groups in accordance with an illustrative embodiment of the present invention.

FIG. 5 is a flow chart detailing the steps of a procedure 500 for compressing data in accordance with an illustrative embodiment of the present invention. The procedure 500 begins in step 505 and continues to step 510 where write data is received. Illustratively, write data may be received as a result of a client issuing a write operation to the storage system. The write data is passed to the file system to be written to a particular data container, e.g., a file. The file system illustratively passes the write data to the compression module in step 515. The file system may utilize, e.g., a local procedure call (LPC) or other form of interprocess communication to pass the write data to the compression module.

The compression module then compresses the write data in step 520. This compression may occur using any of a plurality of compression techniques. Illustratively, the compression module of the storage system has been preconfigured to compress certain types of data using specific compression techniques. Alternatively, certain data containers, such as volumes, etc. may be configured to compress all data written thereto using a specific compression technique. Once the write data has been compressed, the compression module determines if sufficient compression has occurred in step 525. As noted above, a predefined compression threshold is met before compressed data is written. In alternative embodiments of the present invention this compression threshold may be user customizable. Illustratively, the compression threshold is set at 25%; however, it should be noted that in alternative embodiments of the present invention, differing threshold values may be utilized. As such the description of a 25% threshold is to be taken as exemplary only. If the compression has been sufficient, i.e., the compression threshold has been met, the procedure then branches to step 530 and the compression module creates a compression group by, for example, creating a header containing a magic value, adding one or more pointers to be compressed data and a one or more footer pointers containing appropriate magic values. The file system then writes the compression group to the storage devices in step 535 before the procedure 500 completes in step 540.

However, if in step 525 it is determined that insufficient compression has occurred, then the procedure branches to step 545 where the write data is used as the compression group. That is, the uncompressed data is utilized as the compression group. This results in uncompressed data being written to the storage device similar to writing data prior to the present invention. The file system then writes the compression group in step 535 before the procedure completes in step 540.

Figure 6:
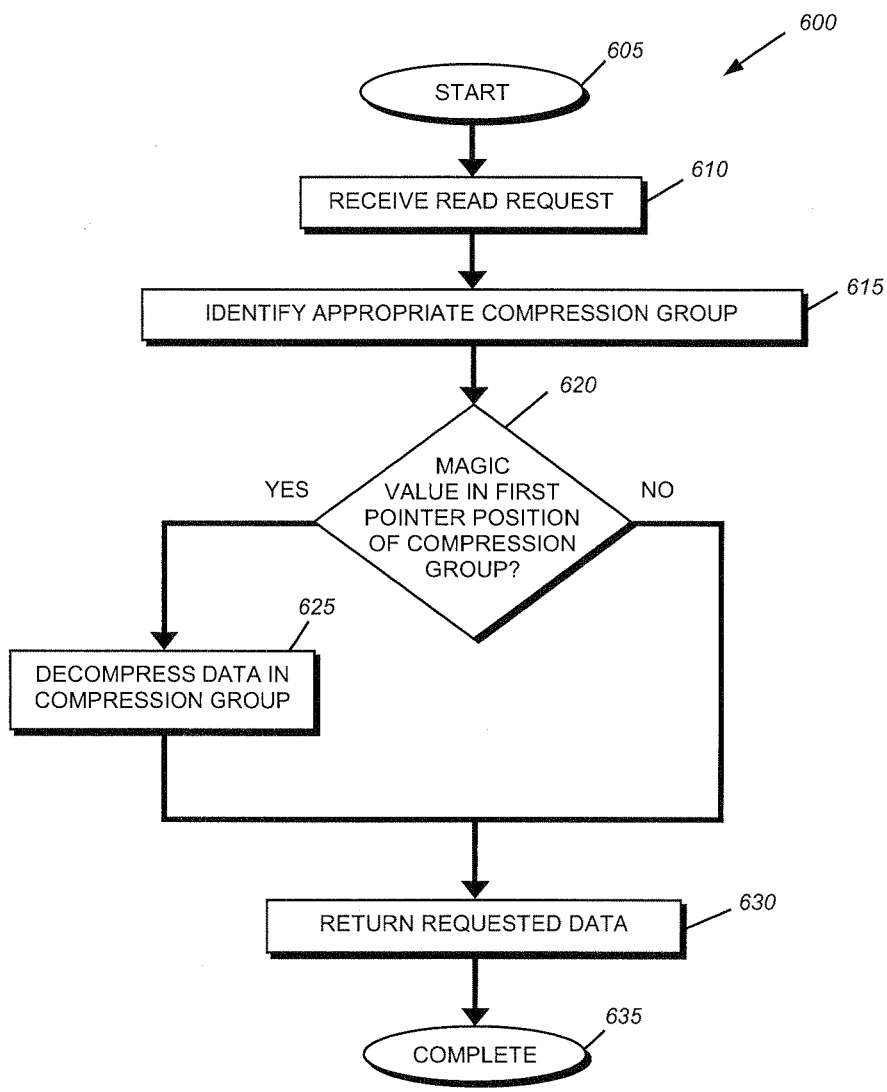
FIG. 6 is a flowchart detailing the steps of a procedure for transparently reading compressed file system data in accordance with an illustrative embodiment of the present invention.

FIG. 6 is a flow chart detailing the steps of a procedure 600 for performing read operations in accordance with an illustrative embodiment of the present invention. The procedure 600 begins in step 605 and continues to step 610 where a read request is received. The file system then identifies the appropriate compression group in step 615. That is, the file system determines which compression group contains the data that is requested by the read request. The file system determines if a magic value is in the first pointer position of the compression group in step 620. If the magic value is in the first pointer position then the compression group contains compressed data. The procedure then branches to step 625 where the data in the compression group is decompressed by the compression module. The requested data is then returned to, e.g., a client, in step 630. The procedure completes in step 635.

However, if in step 620 it is determined that a magic value is not a first pointer position of a compression group, then the compression group does not contain compressed data. As such, the file system returns the requested data in step 630 before the procedure completes in step 635.

The foregoing description has been directed to specific embodiments of this invention. It will be apparent, however, that other variations and modifications may be made to the described embodiments, with the attainment of some or all of their advantages. It is expressly contemplated that the procedures, processes, and methods described herein may be implemented in alternative orders. Furthermore, the teachings of this invention can be implemented as software (including a computer-readable medium having program instructions executing on a computer), hardware, firmware, or a combination thereof. While this description has been written in terms of a file system, the present invention also may be utilized with other data layout systems and with non-file system storage, such as luns and/or other block based storage. Accordingly this description is to be taken only by way of example and not to otherwise limit the scope of the invention. Therefore, it is the object of the appended claims to cover all such variations and modifications as come within the true spirit and scope of the invention.

What is claimed is:

1. A method comprising:

receiving, at a storage system having a processor and a memory, a read request from a client requesting data;

processing the read request to determine that the read request is directed to a compression group of a plurality of compression groups stored on storage devices associated with the storage system;

determining if a value is in the compression group,
where the value in the compression group indicates that a threshold number of storage entities are freed when compressed data is stored in the compression group, and
where the value not in the compression group indicates that the threshold number of storage entities are not freed when the compressed data is stored in the compression group;

decompressing the compressed data in the compression group to obtain decompressed data and returning the decompressed data to a client device in response to determining that the value is in the compression group indicating that the compression group contains compressed data such that the threshold number of storage entities are freed when the compressed data is stored in the compression group; and returning uncompressed data from the compression group to the client device in response to determining that the value is not in the compression group indicating that the compression group does not contain the compressed data such that the threshold number of storage entities are not freed when the compressed data is stored in the compression group such that a decompression operation does not need to be performed.

2. The method of claim 1 wherein the storage devices are disks.

3. The method of claim 1 wherein the value indicates a valid physical address within a block address space.

4. The method of claim 3 wherein the valid physical address includes a reserved physical address.

5. The method of claim 1 wherein the compression group comprises a footer including one or more other values indicating one or more valid physical addresses within a block address space.

6. A non-transitory computer-readable media containing executable program instructions executed by a processor, comprising:

program instructions that receive a read request from a client requesting data;

program instructions that process the read request to determine that the read request is directed to a compression group of a plurality of compression groups stored on storage devices;

program instructions that determine if a value is in the compression group,
where the value in the compression group indicates that a threshold number of storage entities are freed when compressed data is stored in the compression group, and
where the value not in the compression group indicates that the threshold number of storage entities are not freed when the compressed data is stored in the compression group;

program instructions decompress the compressed data in the compression group to obtain decompressed data and program instructions that return the decompressed data to a client device in response to determining that the value is in the compression group indicating that the compression group contains compressed data such that the threshold number of storage entities are freed when the compressed data is stored in the compression group; and program instructions that return uncompressed data from the compression group to the client device in response to determining that the value is not in the compression group indicating that the compression group does not contain the compressed data such that the threshold number of storage entities are not freed when the compressed data is stored in the compression group such that a decompression operation does not need to be performed.

7. The non-transitory computer-readable media of claim 6 wherein the storage devices are disks.

8. The non-transitory computer-readable media of claim 6 wherein the value indicates a valid physical address within a block address space.

9. The non-transitory computer-readable media of claim 8 wherein the valid physical address includes a reserved physical address.

10. The non-transitory computer-readable media of claim 6 wherein the compression group comprises a footer including one or more other values indicating one or more valid physical addresses within a block address space.

11. A system comprising:

a storage operating system executing on a storage system having a processor executing a file system, wherein the processor is configured to:

process a read request to determine that the read request is directed to a compression group of a plurality of compression groups stored on storage devices associated with the storage system;

determine if a value is in the compression group,
where the value in the compression group indicates that a threshold number of storage entities are freed when compressed data is stored in the compression group, and
where the value not in the compression group indicates that the threshold number of storage entities are not freed when the compressed data is stored in the compression group;

decompress the compressed data in the compression group to obtain decompressed data and return the decompressed data to a client device in response to determining that the value is in the compression group indicating that the compression group contains compressed data such that the threshold number of storage entities are freed when the compressed data is stored in the compression group; and return uncompressed data from the compression group to the client device in response to determining that the value is not in the compression group indicating that the compression group does not contain the compressed data such that the threshold number of storage entities are not freed when the compressed data is stored in the compression group such that a decompression operation does not need to be performed.

12. The system of claim 11 wherein the storage entities are associated with disks.

13. The system of claim 11 wherein the value indicates a valid physical address within a block address space.

14. The system of claim 13 wherein the valid physical address comprises a reserved physical address.

15. The system of claim 11 wherein the compression group comprises a footer including one or more other value indicating one or more valid physical addresses within a block address space.

* * * * *